United States Patent [19]

Ahmed

[11] 4,220,930

[45] Sep. 2, 1980

[54] QUASI-LINEAR AMPLIFIER WITH FEEDBACK-CONTROLLED IDLING CURRENTS

[75] Inventor: Adel A. A. Ahmed, Clinton Township, Hunterdon County, N.J.

[73] Assignee: RCA Corporation, New York, N.Y.

[21] Appl. No.: 973,457

[22] Filed: Dec. 26, 1978

[51] Int. Cl.$^2$ ............................................. H03F 3/30
[52] U.S. Cl. .................................... 330/270; 330/271; 330/273
[58] Field of Search ............... 330/146, 262, 270, 271, 330/273

[56] References Cited

U.S. PATENT DOCUMENTS

| | | | |
|---|---|---|---|
| 3,124,757 | 3/1964 | Heiser | 330/273 |
| 3,886,466 | 5/1975 | Wheatley | 330/273 X |
| 3,887,880 | 6/1975 | Leidich | 330/271 |

*Primary Examiner*—James B. Mullins
*Attorney, Agent, or Firm*—Eugene M. Whitacre; Paul J. Rasmussen; Allen LeRoy Limberg

[57] ABSTRACT

A quasi-linear amplifier, wherein each of first and second current dividers maintains a constant ratio between drive currents to respective output transistor means and dummy output transistor means, uses regulation of the quiescent drive currents to the dummy output transistors to establish the quiescent drive currents to the output transistors. The quiescent drive currents to the output transistors are maintained at levels conditioning these transistors for Class AB amplification of signal currents.

22 Claims, 5 Drawing Figures

QUASI-LINEAR AMPLIFIER WITH FEEDBACK-CONTROLLED IDLING CURRENTS

The present invention relates to circuitry for establishing the idling currents in the Class A-B push-pull output transistor amplifier stages of a quasi-linear amplifier.

A quasi-linear amplifier is an amplifier providing linear amplification although its component amplifier stages are non-linear amplifiers, usually Class B or Class AB amplifiers connected in push-pull to provide for linear amplification. To avoid crossover distortion during each transition in conduction of load current from either one of the push-pull output transistor amplifier stages to the other in a quasi-linear amplifier, it is common practice to arrange for an idling current flow through the output circuit of each stage under quiescent conditions. Then there is always conduction to some degree in one or the other of the output transistor amplifier stages. Wheatley, Jr., in column 1, line 8, through column 3, line 28, of his U.S. Pat. No. 3,886,466, issued May 27, 1975 and entitled "BIAS CIRCUITRY FOR STACKED TRANSISTOR POWER AMPLIFIER STAGES" provides an exegesis on the advantages of applying current-mode biasing to the input circuits of push-pull Class A-B output transistor amplifier stages operated in push-pull, rather than following the more usual practice of voltage-mode biasing. In voltage-mode biasing the offset voltage across one or more stabilizing semiconductor junctions is scaled and applied at relatively low-impedance levels to the input circuits of the output transistor amplifier stages. Leidich in U.S. Pat. No. 3,887,880, issued June 3, 1975 and entitled "BIAS CIRCUITRY FOR STACKED TRANSISTOR POWER AMPLIFIER STAGES" describes the sensing of the base current(s) of dummy transistor(s) to provide input currents to current inverting amplifiers, the output currents of which are applied to the input circuits of the push-pull Class AB output transistor amplifier stages, each dummy transistor having the current flow in its output circuit regulated. The attractiveness of this type of circuitry relies upon the fact that the common-emitter forward current gains ($h_{fe}$'s) of integrated transistors can be made to track each other closely, despite the transistors being operated at somewhat different temperatures and with somewhat different densities of current flow through their respective emitter-base junctions.

The present invention is embodied in a quasi-linear Class AB push-pull amplifier having first and second transistor means with respective input and output circuits between which respective current gains are exhibited, connected for supplying amplified push-pull currents, improved insofar as the means for establishing idling current in the output circuits of the first and second transistor means is concerned. Third and fourth transistor means are employed, having respective input and output circuits between which respective current gains are exhibited that are substantially equal to those exhibited by the first and second transistor means, respectively. A regulated current supply supplies first and second quiescent currents, the amplitudes of which are regulated in accordance with the smaller of the currents flowing in the output circuits of the third and fourth transistor means. The first and second quiescent currents are received by the input connections of first and second current divider means, respectively. First and second output connections of the first current divider means are made to the input circuits of the first and third transistor means, respectively, the ratio of current division determining the ratio of the bias currents supplied to the input circuits of the first and third transistor means in this current-mode biasing arrangement. First and second output connections of the second current divider means are made to the input circuits of the second and fourth transistor means, respectively, the ratio of current division determining the ratio of the bias currents supplied to the input circuits of the second and fourth transistor means in this current-mode biasing arrangement. The regulation of the first and second quiescent currents received by the input connections of the first and second current divider means, which is done in accordance with the smaller of the currents passing in the output circuits of the third and fourth transistor means, thus indirectly affects the amplitude of the currents passing through the output circuits of the first and second transistor means, determining the amplitude of these currents under idling conditions.

Figure 1:
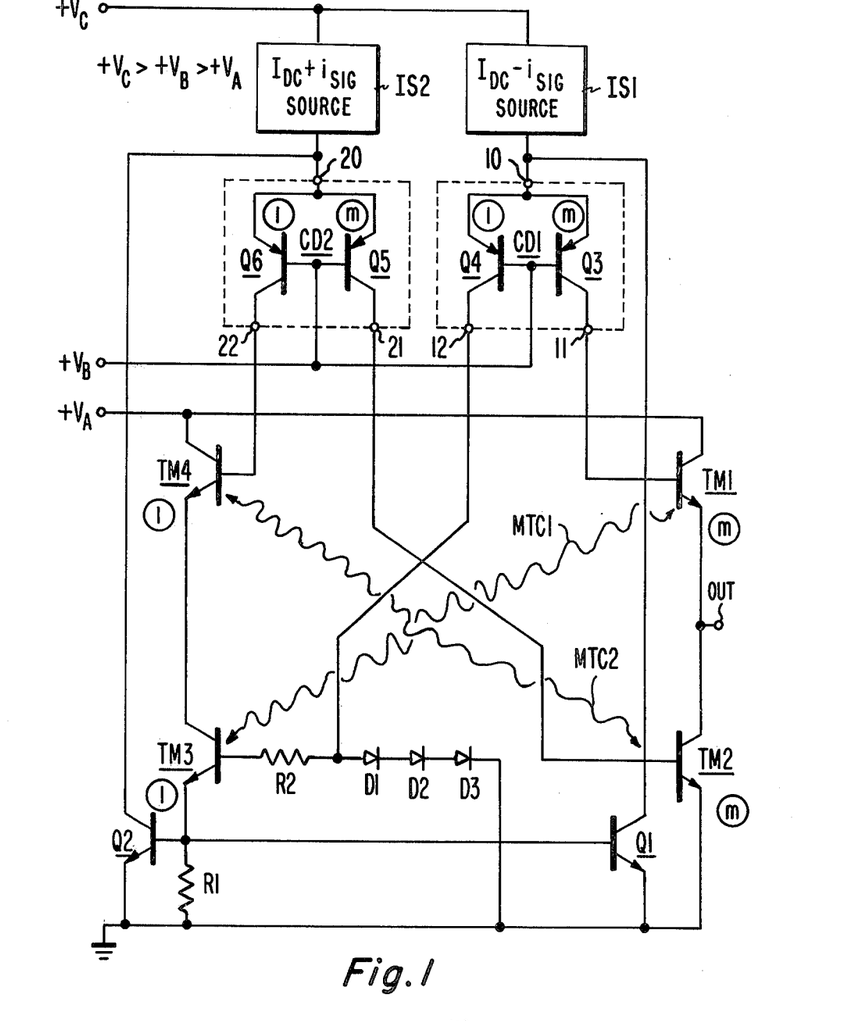
FIGS. 1, 2 and 4 are schematic diagrams, FIGS. 1 and 2 being partially in block form, of quasi-linear amplifiers, each embodying the present invention.

In FIG. 1 first and second current-amplifying transistor means TM1 and TM2, each shown by way of illustration as consisting of a respective NPN transistor, have their output circuits (e.g., the collector-to-emitter circuits of the NPN transistors) connected in series between ground and an operating voltage $+V_A$. The interconnection between these output circuits is connected for supplying amplified push-pull currents via signal output terminal OUT to a load (not shown). The manner in which these output transistor means TM1 and TM2 are supplied operating voltage and are arranged to provide amplified push-pull currents is incidental to the invention being described, and connections of TM1 and TM2 for these ends may be in many if not all of the known forms.

The improved means for establishing idling currents in transistor means TM1 and TM2 includes third and fourth dummy output transistor means TM3 and TM4. TM3 and TM4 have current gains substantially equal to those of TM1 and TM2, respectively, and are each shown as consisting of a respective NPN transistor. Transistor means TM1 and TM3 preferably are arranged to have mutual thermal coupling MTC1 between them as shown. This lessens differences in their operating temperatures that might affect the matching of their common-emitter forward current gains or $h_{fe}$'s. For similar reasons transistor means TM2 and TM4 preferably are arranged to have mutual thermal coupling MTC2 between them.

The improved means for establishing idling currents in output transistor means TM1 and TM2 also includes first and second current dividers CD1 and CD2. Current divider CD1 receives an input current at its input connection 10 and divides this input current into fractions appearing at the first and second output connections 11, 12 of CD1 as output currents in known proportions to the input current to CD1. The output currents at connections 11 and 12 are respectively applied to the input circuits of transistor means TM1 and TM3—e.g., to the base circuits of the NPN transistors TM1 and TM3. Current divider CD2 receives an input current at its input connection 20 and divides this input current into fractions appearing at the first and second output connections 21, 22 of CD2 as output currents in known proportions to the input current to CD2. The output currents at connections 21 and 22 are respectively applied to the input circuits of transistor means TM2 and TM4—e.g., to the base circuits of the NPN transistors TM2 and TM4.

That one of the currents in the output circuits of dummy output transistor means TM3 and TM4 which tends to be the smaller is continuously sensed, and will be in prescribed ratio to the idling currents in the output transistor means TM1 and TM2 under no-signal conditions. This, owing to the current divider CD1 maintaining the currents to the input circuits of transistor means TM1 and TM3 in prescribed ratio, on one hand, and to the current divider CD2 maintaining the currents to the input circuits of transistor means TM2 and TM4 in prescribed ratio, on the other hand. This sensing is carried out, for example, using a current sensing resistance R1 with a first end grounded and with a second end connected to $+V_A$ via a series connection of the output circuits of transistor means TM3 and TM4. In this connection the one of the transistor means TM3 and TM4 supplied the larger current to its input circuit—i.e., the larger base current where TM3 and TM4 consist of respective NPN transistors, as shown in FIG. 1—will attempt to conduct more current through its output circuit than the other of the transistor means will allow, owing to the smaller current supplied its input circuit. This leads to the one of the transistor means TM3 and TM4 supplied the larger current to its input circuit conducting to decrease the voltage across its output circuit to the point the current gain of that transistor means is sufficiently reduced that current through its output circuit is substantially equal to that through the output circuit of the other of the transistor means (that one having the input circuit supplied smaller current). Thereupon Kirchoff's Law of Currents is satisfied, and there will be no further decrease in the voltage across the output circuit of the transistor means supplied the larger current to its input circuit. The current flowing through the serially connected output circuits of transistor means TM3 and TM4 flows through current sensing resistance R1 to cause, in accordance with Ohm's Law, a potential drop thereacross proportional to that current.

This potential drop controls the shunt regulation of both (a) the current applied to the input connection 10 of current divider CD1 from a source IS1 of current and (b) the current applied to the input connection 20 of current divider CD2 from a source IS2 of current. Sources IS1 and IS2 are shown as being of types supplying respective currents with respective d-c components of the same amplitude $I_{DC}$. FIG. 1 shows the means for doing this shunt regulating being common-emitter NPN transistors Q1 and Q2 with respective base electrodes receptive of the potential drop across R1. The collector electrodes of Q1 and Q2 respectively connected to input connection 10 of current divider CD1 and to input connection 20 of current divider CD2. The amplitude of the $I_{DC}$ d-c components supplied by current sources IS1 and IS2 is sufficiently large that, if these $I_{DC}$ components were not shunt-regulated before their division by current dividers CD1 and CD2, respectively, the portions of these d-c components applied to the input circuits of transistor means TM1 and TM2 respectively would condition these transistors to conduct larger-than-desired idling current through their respective output circuits. The tendency towards larger-than-desired idling current is checked at the desired idling current level, however, by the current flowing through the serially connected output circuits of transistor means TM3 and TM4, and thence through resistor R1, being of such amplitude that the potential drop across R1 biases the shunt-regulator transistors Q1 and Q2 into conduction. Q1 then shunts away from input connection 10 of current divider CD1 such of the $I_{DC}$ component of the current from source IS1 that would otherwise cause excessive idling current to flow in the output circuit of transistor means TM1. Similarly, Q2 shunts away from input connection 20 of current divider CD2 such of the $I_{DC}$ component of the current from source IS2 that would otherwise cause excessive idling current to flow in the output circuit of transistor means TM2.

Current dividers CD1 and CD2 are of a type that accepts input currents of only one polarity through their respective input connections 10 and 20. This rectifying property is brought about in CD1 owing to the parallelled emitter-base junctions of PNP transistors Q3 and Q4, which are proportioned to divide current received at input connection in m:1 ratio between them as emitter currents. These emitter currents in m:1 ratio are coupled by the common-base amplifier actions of Q3 and Q4, respectively, to provide collector currents in m:1 ratio at output connections 11 and 12 of current divider CD1. These collector currents are smaller than the emitter currents generating them by the base currents of Q3 and Q4, respectively, which base currents are negligibly small in good modern transistors. PNP transistors Q5 and Q6 in current divider CD2 are connected similarly to the PNP transistors Q3 and Q4, respectively, in current divider CD1 and provide CD2 with the ability to rectify current applied to its input connection 20. The rectifying capabilities of current dividers CD1 and CD2 make it unnecessary to supply Class B drive signals to their input connections—as might be done, for example, using the "PHASE SPLITTING AMPLIFIER" described by C. F. Wheatley, Jr., in U.S. Pat. No. 3,573,645, patented Apr. 6, 1971, if the current dividers were of a type without rectifying properties. This permits current sources IS1 and IS2 to be of the types supplying balanced Class A signal components $i_{SIG}$ and $-i_{SIG}$ superimposed on d-c component $I_{DC}$.

Positive excursions of the input signal component of the signal applied from source IS1 to input connection 10 of current divider CD1 increase the base current drives supplied from its output connections 11 and 12 to transistor means TM1 and TM3, respectively. At the same time there would be no increase in the current supplied to the input connection 20 of current divider CD2 in the case where current sources IS1 and IS2 had Class B signal currents superimposed on them. Indeed, there is decrease in the current supplied to the input connection 20 of current divider CD2 in the FIG. 1 circuit, where the current divider CD2 is of a type which rectifies current supplied to its input connection and current source IS2 supplies current with a Class A signal component $i_{SIG}$ superimposed on its d-c component $I_{DC}$. Consequently, the base drive to TM3 increases while that to TM4 (as well as to TM2) does not, placing TM3 in saturated conduction to cause the lesser conduction of TM4 to take over control of the base potential applied to the shunt regulating transistors Q1 and Q2. Consequently, there is no increase in the current diverted to the collectors of Q1 and Q2 from sources IS1 and IS2, respectively; and there will actually be some decrease in the FIG. 1 circuit.

The "base" current to the dummy output transistor means (TM3 in FIG. 1) having its "emitter" electrode connected to R1 is limited to a value insufficient to increase the potential drop across R1 appreciably, so that the other dummy output transistor means (TM4 in FIG. 1) maintains control of the shunt regulation of currents supplied to the input connections 10 and 20 of current dividers CD1 and CD2. In FIG. 1 this limiting is performed by resistance R2 arranged to conduct current from the output connection 12 of current divider CD1 to the base of TM3 and by the serial connection of diodes D1, D2 and D3 from output connection 12 to ground. When the base current flow to TM3 increases, thus increasing the potential drop across R2 to raise the potential at output connection 12, the serially connected diodes D1, D2 and D3 become conductive to shunt excess drive current from being applied to the base of TM3.

Similarly, positive excursions of input signal component of the signal applied from source IS2 to input connection 20 of current divider CD2 increase the base current drives from its output connections 21 and 22 to transistor means TM2 and TM4, respectively, while there is either no increase or a decrease in the current supplied to the input connection 10 of current divider CD1. This places TM4 in saturated conduction and allows TM3 to take over control of the shunt regulation of Q1 and Q2.

A direct potential $+V_B$ is applied to the base electrodes of current divider transistors Q3, Q4, Q5 and Q6 which is somewhat more positive than the direct potential $+V_A$ supplied as operating potential to transistor means TM1 and TM4. This allows forward conduction across the collector-base junction of the NPN transistor in transistor means TM1 to forestall the possibility of saturation in Q3 during positive excursions of $-i_{SIG}$; and this allows forward conduction across the collector-base junction of the NPN transistor in transistor means TM4 to forestall the possibility of saturation in Q6 during positive excursions of $i_{SIG}$. The clamping action of the emitter-base junction of TM2 forestalls the possibility of saturation in Q5 during positive excursions of $i_{SIG}$; and the clamping action of serially connected diodes D1, D2 and D3 forestalls the possibility of saturation in Q4 during positive excursions of $-i_{SIG}$. One seeks to avoid saturation conditions in the current divider transistors Q3, Q4, Q5 and Q6 because this would adversely affect the (m+1):m:1 ratio between the input current and first and second output currents of each of the current dividers CD1 and CD2.

The response, at output connection 11 of current divider CD1 to positive excursions of the signal component $-i_{SIG}$ applied to its input connection 10, is applied as Class AB base drive to transistor means TM1. The response, at output connection 21 of current divider CD2 to positive excursions of the signal component $i_{SIG}$ applied to its input connection 20, is applied as Class AB base drive to transistor means TM2. Since $i_{SIG}$ and $-i_{SIG}$ are anti-phase signals, these Class AB base drives are applied alternately to transistor means TM1 and TM2 in similar fashion to other Class AB amplifiers in which the output amplifier devices are driven current-mode.

Figure 2:
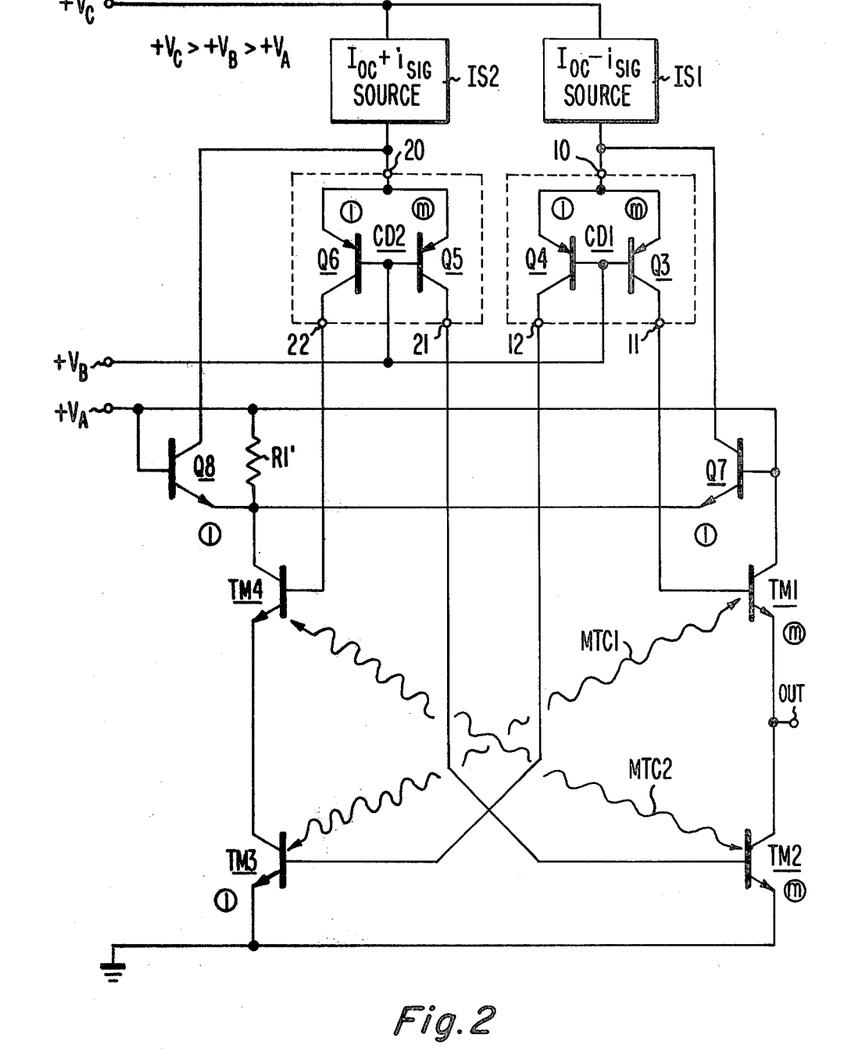

In the FIG. 2 quasi-linear amplifier, current sensing resistance R1' is connected in series with the principal conduction paths of transistor means TM3 and and TM4 between the $+V_A$ bus and ground. However, in contrast to current sensing resistance R1 of FIG. 1, current sensing resistance R1' is located proximate to the $+V_A$ bus rather than to ground. This is advantageous in that one need not provide for limiting the base current drive available to either of the transistor means TM3 and TM4 to avoid undesirable current flow in the current sensing resistor R1' during times when the one of these transistor means proximate to R1' is saturated, since the emitter current available to it is limited by the other of these transistor means. One need not provide for limiting the base current drive to either of the transistor means TM3 and TM4 if one locates a current sensing resistance in series connection with and between the principal current conduction paths of these transistor means, either, but one must differentially sense the potentials at the ends of the current sensing resistance in such case to develop a feedback current to be apportioned between the input connections 10 and 20 of current divider means CD1 and CD2.

The connection of current sensing resistance R1' at one of its ends to the $+V_A$ bus permits simpler shunt regulation of the currents to the input connections 10 and 20 of current dividers CD1 and CD2. Shunt regulation is carried forward by common-base amplifier transistors Q7 and Q8 whenever the potential drop across current sensing resistance R1 increases sufficiently to forward bias the emitter-base junctions of Q7 and Q8. The collector electrodes of Q7 and Q8 then demand collector current from input connections 10 and 20 of current dividers CD1 and CD2, respectively.

In connections of the current sensing resistance as shown in FIG. 2 or between the principal current condution paths of transistor means TM3 and TM4, one may interchange the positions of the principal current and conduction paths of transistor means TM3 and TM4 in their series connection with current sensing resistance to obtain further embodiments of the present invention.

Figure 3:
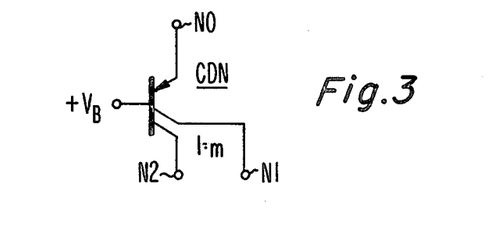
FIG. 3 is a schematic diagram of a modification that can be made to the FIG. 1 or FIG. 2 quasi-linear amplifier to provide further embodiments of the present invention.

FIG. 3 shows a current divider CDN of a form appropriate for replacing CD1 or CD2 in the FIGS. 1 and 2 quasi-linear amplifiers. CDN essentially consists of a dualcollector PNP transistor receiving $+V_B$ at its base electrode, having an input connection NO at its emitter electrode for receiving current to be divided, and having first and second output connections N1 and N2 at respective collector electrodes thereof for providing respective output currents in m:1 ratio, the sum of which output currents equals the input current except for the relatively small current flowing through its base electrode.

Figure 4:
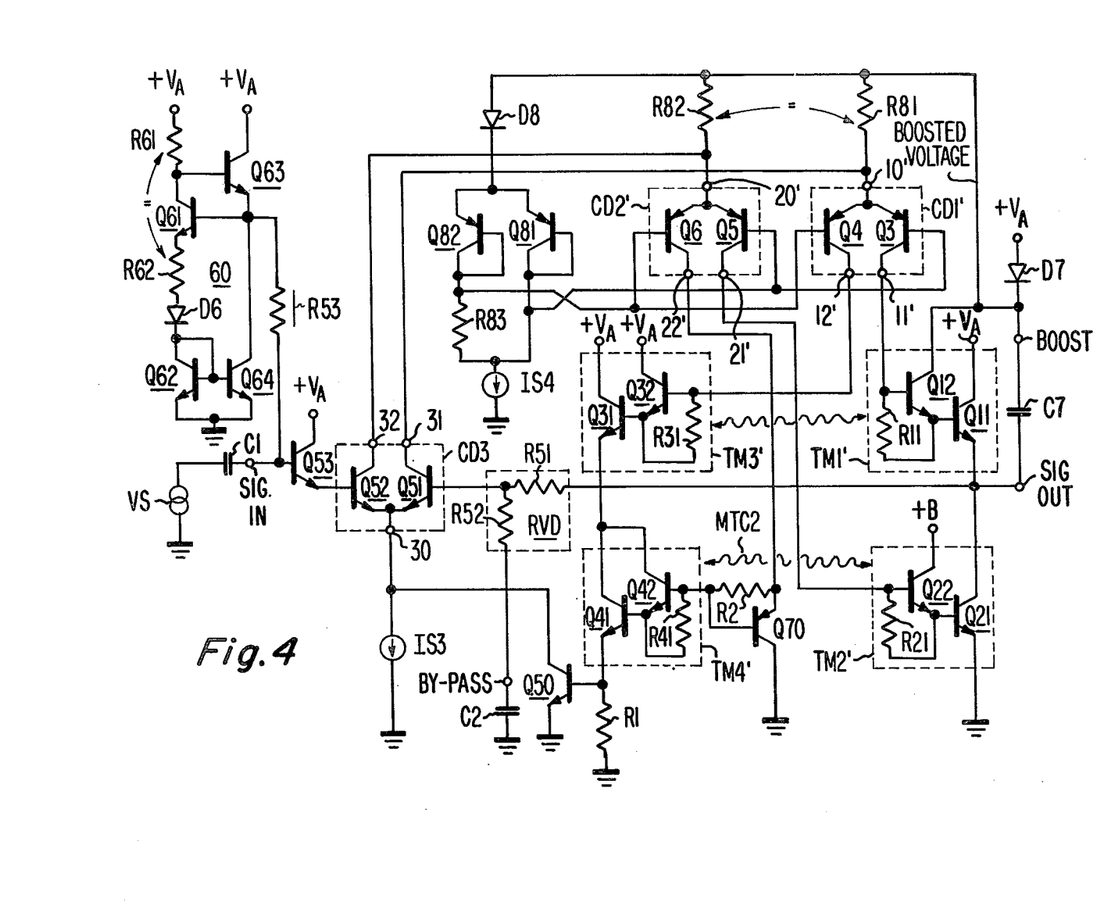

The FIG. 4 quasi-linear amplifier differs from that of FIG. 1 in several respects. Transistor means TM1, TM2, TM3 and TM4 are replaced by transistor means TM1', TM2' TM3' and TM4', respectively. Each transistor means TMX' of this latter group is a compound transistor comprising a respective first NPN transistor QX1 preceded in direct-coupled cascade by a respective second NPN transistor QX2 in commoncollector amplifier configuration and with a resistor RX1 parallelling its base-emitter junction, where X is a variable that successively takes the values 1, 2, 3 and 4. This latter group of transistor means, being compound transistors, tend to have higher current gains than obtainable using simple, single transistors.

Current divider means CD1' and CD2' differ from current divider means CD1 and CD2 in that the base potentials of their respective PNP transistors Q3 and Q5 are less positive than the base potentials of their respective PNP transistors Q4 and Q6. This causes the input currents applied to the respective input terminals 10' and 20' of CD1' and CD2' to be divided such that larger currents appear at their respective output terminals 11' and 21' than appear at their respective output terminals 12' and 22'. Thus larger drive currents are supplied to output transistor means TM1' and TM2' from terminals T11' and T21', respectively than are supplied from terminals 12' and 22' to dummy output transistor means TM3' and TM4', respectively. From the present inventor's U.S. Pat. No. 3,867,685, issued Feb. 18, 1975 and entitled "FRACTIONAL CURRENT SUPPLY", or from B. Crowle's U.S. Pat. No. 4,025,842, issued May 24, 1977 and entitled "CURRENT DIVIDER PROVIDED TEMPERATURE-DEPENDENT BIAS POTENTIAL FROM CURRENT REGULATOR", it is known that if one applies a difference in base potentials to emitter-coupled transistors which is proportional to the absolute temperature at which their emitter-base junctions are operated, the proportionality between their collector currents is constant despite change in that temperature.

The principal current conduction paths of dummy output transistor means TM3' and TM4' are serially connected in reverse order from those of TM3 and TM4, between positive operating potential ($+V_A$) and the current-sensing resistance R1. A simple PNP transistor Q70 replaces serially connected diodes in cooperating with resistance R2 to provide a circuit for limiting drive current applied to TM3' and for preventing saturation of Q6. The two shunt regulating transistors Q1 and Q2 are replaced by a single shunt regulating transistor Q50, the collector current demand of which is apportioned between the respective input connections 10' and 20' of current dividers CD1' and CD2' by a still further current divider CD3. CD3 is shown as comprising a pair of NPN transistors Q51 and Q52 with emitters joined at the input connection 30 of CD3 and with respective collectors at first and second output connections 31 and 32 of CD3.

Q51 and Q52 are also connected in long-tailed pair configuration for signal, with a constant current generator IS3 connected to their joined emitter electrodes for withdrawing a tail current. This long-tailed pair configuration provides balanced drive signals to the respective input connections 10' and 20' of current dividers CD1 and CD2 from the collectors of Q51 and Q52, respectively. This is in response to input signal voltage variations applied to the base of Q52 from input signal voltage source VS via d-c blocking capacitor C1, signal input terminal SIG IN, and common-collector-amplifier NPN transistor Q53. Overall voltage feedback is applied to the base of Q51 from an output signal terminal SIG OUT at the interconnection of output transistor means TM1' and TM2'. For a-c output signal voltage components at terminal SIG OUT, capacitor C2 provides a by-pass to ground; resistive elements R51 and R52 with respective resistances $R_{51}$ and $R_{52}$ behave as a resistive potential divider RVD for signal. Accordingly, the feedback connection maintains the overall voltage gain of the FIG. 4 quasi-linear amplifier close to $[(R_{51}/R_{52})+1]$. The d-c component of voltage at terminal SIG OUT passes through R51 without substantial attenuation, completing a direct-coupled feedback loop that regulates that d-c component to a voltage equal to the quiescent base potential of Q52, designed to be one-half $+V_A$.

The $+V_A/2$ quiescent potential is applied to the base of Q52 from the emitter of Q53 responsive to a $[(+V_a/2)+V_{BE}]$ potential applied to the base of Q53 via its base resistance R53 from a voltage divider network 60. In voltage divider network 60, the collector-to-emitter paths of transistors Q61 ahnd Q62 are conditioned—by direct coupled collector-to-base feedback via the emitter-follower action of NPN transistor Q63 and by direct coupled collector-to-base feedback via direct connection, respectively—to conduct in series with the collector resistor R61 of Q61, the emitter resistor R62 of Q61 offering resistance equal to that offered by R61, and a diode D6 connecting R62 to the collector of grounded-emitter transistor Q62. The series connection of Q62, diode-connected by virtue of the direct connection between its collector and base electrodes, and of D6, which may itself consist of a diode-connected transistor, maintains the lower end of R62 at $+2V_{BE}$ potential. The configuration comprising Q61, Q63 and equal-valued resistances R61 and R62 provides an output voltage at the emitter of Q63 halfway between those applied at the ends of R62 and R61 remote from Q61, as taught by L. A. Harwood in his U.S. Pat. No. 3,383,612, issued May 14, 1968 and entitled "INTEGRATED CIRCUIT BIASING ARRANGEMENTS". NPN transistor Q64 is in current mirror amplifier configuration with Q62 to withdraw an emitter current from Q63 substantially equal to the emitter current of Q61. R53 is shown as a doubly diffused or "pinch" resistor and has a substantial resistance value.

The FIG. 4 quasi-linear amplifier, like many in the prior art, has a boost circuit comprising boost capacitor C7 and a diode D7 for supplying a boosted potential reaching above $+V_A$ operating voltage to the circuitry driving its output transistor means. This is done to permit Q11 in output transistor means TM1 to be driven into saturation, and to this end the common-collector-amplifier transistor Q12 preceding Q11 in cascade receives boosted potential at its collector electrode.

The base potentials of Q3, Q4, Q5 and Q6 follow the boosted potential, as will be presently explained. Therefore resistive elements R81 and R82 applying this boosted potential to the input connections 10' of current divider CD1' and 20' of current divider CD2', respectively, will function as constant current generators, respectively, supplying the direct currents to be drawn off partially by the quiescent collector current demand of Q51 and that of Q52. Constant current source IS4 is connected as a sink for withdrawing current from branch circuits respectively including diode-connected transistor Q81, resistive element R83 and diode-connected transistor Q82. The currents withdrawn from these branch circuits in turn are withdrawn together in the forward direction through diode D8. Responsive to these currents being drawn through them, diode D8 develops a $V_{BE}$ offset potential thereacross; and diode-connected transistors Q81 and Q82 develop offset potentials thereacross nominally of $V_{BE}$ value, but which actually differ by a small predictable amount that varies substantially proportionally with the temperature of Q81 and Q82, as can be derived by analogy to circuits known in the art—e.g., the present inventor's U.S. Pat.

No. 3921013, patented Nov. 18, 1975, and entitled "BIASING CURRENT ATTENUATOR". This small difference in voltage appears across resistor R83 and biases the bases of Q3 and Q5 less positively than the bases of Q4 and Q6. As noted above, biasing the base of Q3 less positively than the base of Q4 results in current applied to terminal 10' dividing between Q3 and Q4 to provide them relatively large and relatively small emitter currents, respectively. Biasing the base of Q5 less positively than the base of Q6 results in current applied to terminal 20' dividing between Q5 and Q6 to provide them relatively large and relatively small emitter currents, respectively.

Figure 5:
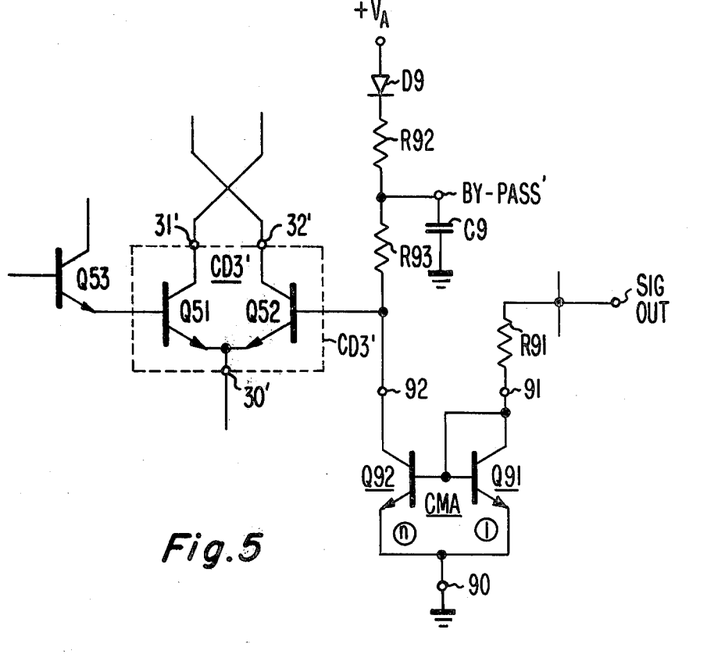
FIG. 5 is a schematic diagram of a modification that can be made to the FIG. 4 quasi-linear amplifier to provide a further embodiment of the present invention.

FIG. 5 shows modifications made to the FIG. 4 quasi-linear amplifier to accommodate a different form of overall feedback. Current divider CD3', replacing CD3, has transistor Q51 connected at its base to receive input signal superimposed on a $[(+V_a/2)+V_{BE}]$ quiescent potential from common-collector-amplifier transistor Q53; and overall feedback from output signal terminal SIG OUT is applied to the base of Q52 via an inverting amplifier of the sort described by S. A. Steckler in his U.S. Pat. No. 3,531,730, patented Sept. 29, 1970 and entitled "SIGNAL TRANSLATING STAGE PROVIDING DIRECT VOLTAGE". This inverting amplifier includes NPN transistors Q91 and Q92 as the master and slave transistors, respectively, of a current mirror amplifier CMA having input, output and common connections at 91, 92 and 90, respectively.

Current mirror amplifier CMA is of a type tending to maintain a $V_{BE}$ offset potential between its common and input connections 90 and 91. So input current to input connection 90 will equal the potential at output signal terminal SIG OUT, less this $V_{BE}$, all divided by the resistance $R_{91}$ of resistor R91 having its first and second ends connected at SIG OUT and at input connection 91 of CMA, respectively. Current mirror amplifier CMA is of a type exhibiting a current gain of P−n, where n is a positive number usually chosen to be unity, between its input and output connections 91 and 92. This amplified current flows through the series connection of forward-conducting diode D9 and resistors R92 and R93 (with respective resistance $R_{92}$ and $R_{93}$) between $+V_A$ and the output connection 92 of CMA. By choosing $R_{92}+R_{93}$ to equal $(R_{91}/n)$, the direct potential drop across R92 and R93 equals that across R91. It adds to the offset potential across forward conducting diode D9 to provide a potential quiescently offsetting the base electrode of Q52 from $+V_A$ by an amount equal to the quiescent potential between terminal SIG OUT and ground. Since the overall feedback will strive to maintain the base of Q52 at the same $(+V_A/2)$ potential as at the base of Q51, it also operates then to maintain SIG OUT at a quiescent potential of $(+V_A/2)$. Capacitor C9 connected between ground and terminal BYPASS', at the interconnection of R92 and R93, reduces the gain of the overall feedback connection to $nR_{93}/R_{91}$ for signal components.

One skilled in the art and armed with the foregoing disclosure will be enabled to generate other embodiments of the present invention quite readily and the appended claims should be liberally construed to include such embodiments as partake of the spirit of the above-described invention. E.g., current dividers of the sort shown in FIG. 1 or 3 may replace current dividers CD1' and CD2' in the FIG. 4 quasi-linear amplifier, as shown in FIG. 4 or modified per FIG. 5, $+B_B$ voltage being provided by a $2V_{BE}$ offset from BOOST VOLTAGE, as further embodiments of the present invention.

What we claim is:

1. A quasi-linear amplifier having first and second transistor means with respective input and output circuits between which respective current gains are exhibited, connected as Class AB amplifiers for supplying amplified push-pull currents from their output circuits to a load, improved in having means for establishing idling currents in the output circuits of said first and second transistor means that comprises:

third transistor means having input and output circuits between which a current gain is exhibited tending to be substantially equal to that exhibited by said first transistor means between its input and output circuits;

fourth transistor means having input and output circuits between which a current gain is exhibited tending to be substantially equal to that exhibited by said second transistor means between its input and output circuits;

means for supplying quiescent current to the input circuit of said first transistor means;

means for supplying quiescent current to the input circuit of said second transistor means;

means for supplying quiescent current to the input circuit of said third transistor means in fixed proportion to that supplied to the input circuit of said first transistor means;

means for supplying quiescent current to the input circuit of said fourth transistor means in fixed proportion to that supplied to the input circuit of said second transistor means;

means for sensing the smaller of the currents flowing in the output circuits of said third and fourth transistor means; and feedback means responsive to the sensed current tending to exceed a predetermined threshold value for reducing the quiescent currents supplied to the input circuits of said third and fourth transistor means to counteract such tendency.

2. A quasi-linear amplifier having first and second transistor means with respective input and output circuits between which respective current gains are exhibited, connected as Class AB amplifiers for supplying amplified push-pull currents from their output circuits to a load, improved in having means for establishing idling currents in the output circuits of said first and second transistor means that comprises:

third transistor means having input and output circuits between which a current gain is exhibited tending to be substantially equal to that exhibited by said first transistor means between its input and output circuits;

fourth transistor means having input and output circuits between which a current gain is exhibited tending to be substantially equal to that exhibited by said second transistor means between its input and output circuits;

regulated current supply means for supplying first and second quiescent currents, the amplifudes of which are regulated in accordance with the one of the currents flowing in the output circuits of said third and fourth transistor means tending to be the smaller;

first current divider means having an input connection receptive of said first quiescent current and having first and second output connections to the input circuits of said first and said third transistor means, respectively, for causing the current through the output circuit of said third transistor means to tend to be in proportion to the current through the output circuit of said first transistor means; and second current divider means having an input connection receptive of said second quiescent current and having first and second output connections to the input circuits of said second and said fourth transistor means, respectively, for causing the current through the output circuit of said fourth transistor means to tend to be in proportion to the current through the output circuit of said second transistor means.

3. A quasi-linear amplifier as set forth in claim 2 wherein:

means responsive to an input signal for superimposing Class A signal variations on said first and second quiescent currents, respectively, are included;

said first current divider means is of a type conducting only current of the same polarity as said first quiescent current through its input connection, thereby responding only to selected portions of the Class A signal variations superimposed on said first quiescent current for supplying Class AB drive currents from its first and second output connections to the input circuits of said first and of said third transistor means respectively; and said second current divider means is of a type conducting only current of the same polarity as said second quiescent current through its input connection, thereby responding only to selected portions of the Class A signal variations superimposed on said second quiescent current for supplying Class AB drive currents from its first and second output connections to the input circuits of said second and of said fourth transistor means, respectively.

4. A quasi-linear amplifier comprising:

first and second terminals for receiving an operating potential therebetween, and a third terminal for connection to an output load for said quasi-linear amplifier;

first, second, third and fourth current amplifying transistor means, each having a respective input electrode and having respective output and common electrodes defining the ends of its principal current conduction path, the output electrodes of said first and second transistor means being respectively connected to said second terminal and to said third terminal and their common electrodes being respectively connected to said third terminal and to said first terminal;

a current sensing resistance having a first end connected to one of said first and second terminals and having a second end connected to the other of said first and second terminals through a series connection of the principal current conduction paths of said third and fourth transistor means;

means for supplying a quiescent current to the input electrode of said third transistor means including means for regulating the value of that quiescent current in response to potential drop across said current sensing resistance tending to exceed a predetermined value;

means for supplying a quiescent current to the input electrode of said first transistor means in fixed proportion to the quiescent current supplied to the input electrode of said third transistor means;

means for supplying a quiescent current to the input electrode of said fourth transistor means including means for regulating the value of that quiescent current in response to potential drop across said current sensing resistance tending to exceed a predetermined value; and means for supplying a quiescent current to the input electrode of said second transistor means in fixed proportion to the quiescent current supplied to the input electrode of said fourth transistor means.

5. A quasi-linear amplifier as set forth in claim 4 wherein the first end of said current sensing resistance connects to said first terminal and wherein there is included current limiter means for constraining the flow of current to the input electrode of the one of the third and fourth transistor means having its principal current conduction path least remotely connected to said current sensing resistance.

6. A quasi-linear amplifier as set forth in claim 5 wherein said third transistor means has its principal current conduction path less remotely connected to the second end of said current sensing resistance than has said fourth transistor means, and wherein current limiter means for constraining the flow of current essentially consists of:

a further current sensing resistance having first and second ends which are connected for applying to the input electrode of said third transistor the quiescent current supplied to it, its first end being connected directly to the input electrode of said third transistor to form a series circuit with it and said beforenamed current sensing resistance; and threshold conductive means connected between said first terminal and the second end of said further current sensing resistance for conducting whenever the potential across said series circuit exceeds by prescribed amount its value under quiescent conditions.

7. A quasi-linear amplifier as set forth in claim 5 wherein said fourth transistor means has its principal current conduction path less remotely connected to the second end of said current sensing resistance than has said third transistor means, and wherein said current limiter means essentially consists of:

a further current sensing resistance having first and second ends which are connected for applying the input circuit of said fourth transistor the quiescent current supplied to it, its first end being connected directly to the input circuit of said fourth transistor to form a series circuit with it and said beforenamed current sensing resistance; and threshold conductive means connected between said first terminal and the second end of said further current sensing resistance for conducting whenever the potential across said series circuit exceeds by prescribed amount its value under quiescent conditions.

8. A quasi-linear amplifier as set forth in claim 4 wherein the first end of said current sensing resistance connects to said second terminal.

9. A quasi-linear amplifier comprising: first and second terminals for receiving a reference potential and an operating potential, respectively, and a third terminal for connection to an output load for said quasi-linear amplifier;

first, second, third and fourth current-amplifying transistor means of a first conductivity type, each having a respective input electrode and having respective output and common electrodes defining the ends of its principal current conduction path, the output electrodes of said first and second transistor means being respectively connected to said second terminal and to said third terminal and their common electrodes being respectively connected to said third terminal and to said first terminal;

means for supplying to a first node a first quiescent current of the polarity required as forward bias current to the input electrode of transistor means of said first conductivity type;

means for supplying to a second node a second quiescent current of the polarity required as forward bias current to the input electrode of transistor means of said first conductivity type;

first current divider means having an input connection at said first node and having first and second output connections to the input electrodes of said first and third transistor means, respectively, for supplying them proportionally related currents;

second current divider means having an input connection at said second node and having first and second output connections to the input electrodes of said second and fourth transistor means, respectively, for supplying them proportionally related currents;

means sensing the smaller of the currents flowing in the principal current conduction paths of said third and fourth transistor means for providing a control response;

means responsive to that control response tending to exceed a predetermined threshold value to divert portions of said first and second quiescent currents from said first and second nodes, respectively.

10. A quasi-linear amplifier as set forth in claim 9 wherein said first current divider means comprises:

a pair of transistors of a second conductivity type complementary to said first conductivity type, having respective emitter electrodes joined at the input connection of said first current divider means, having respective collector electrodes respectively connected to the first output connection of said first current divider means and to its second output connection, and having respective base electrodes joined to receive a first bias potential——and wherein said second current divider means comprises:

another pair of transistors of said second conductivity type, having respective emitter electrodes joined at the input connection of said second current divider means, having respective collector electrodes respectively connected to the first output connection of said second current divider means and to its second output connection, and having respective base electrodes joined to receive a second bias potential.

11. A quasi-linear amplifier as set forth in claim 9 wherein said first current divider means comprises:

a first dual-collector transistor of a second conductivity type complementary to said first conductivity type having an emitter electrode at the input connection of said first current divider means, having first and second collector electrodes respectively connected to the first output connection of said first current divider means and to its second output connection, and having a base electrode connected to receive a first bias potential—wherein said second current divider means comprises:

a second dual-collector transistor of said second conductivity type having an emitter electrode at the input connection of said second current divider means, having first and second collector electrodes respectively connected to the first output connection of said second current divider means and to its second output connection, and having a base electrode connected to receive a second bias potential.

12. A quasi-linear amplifier as set forth in claim 9 wherein said first current divider means comprises:

a pair of transistors of a second conductivity type complementary to said first conductivity type having respective emitter electrodes joined at the input connection of said first current divider means, one of them having a base electrode connected to receive a first bias potential and the other of them having a base electrode connected to receive a potential differing from said first bias potential in prescribed amount, one of them having a collector electrode connected to the first output connection of said first current divider means and the other of them having a collector electrode connected to its second output connection—and wherein said second current divider means comprises:

another pair of transistors of said second conductivity type having respective emitter electrodes joined at the input connection of said second current divider means, one of them having a base electrode connected to receive a second bias potential and the other of them having a base electrode connected to receive a potential differing from said second bias potential in prescribed amount, one of them having a collector electrode connected to the first output connection of said second current divider means and the other of them having a collector electrode connected to its second output connection.

13. A quasi-linear amplifier as set forth in claim 10, 11 or 12 wherein said second bias potential equals the first bias potential.

14. A quasi-linear amplifier as set forth in claim 9 including:

a fourth terminal for receiving a potential departing from said reference potential more than said operating potential;

a first number of transistor means of a second conductivity type complementary to said first conductivity type being connected to provide said first current divider means, having emitter electrode means at the input connection of said first current divider means, having respective collector electrode means for respective connections to the first and second output connections of said first current divider means, and having base electrode means;

a second number of transistor means of said second conductivity type being connected to provide said second current divider means, having emitter electrode means at the input connection of said second current divider means, having respective collector electrode means for respective connections to the first and second output connections of said second current divider means, and having base electrode means;

means for offsetting the potentials of the base electrode means of said first and second numbers of transistors, which are alike in number and are of said second conductivity type, by specified amounts from the potential received at said fourth terminal;

a first resistance connected between said fourth terminal and said first node, at which the emitter electrode means of said first number of transistor means of said second conductivity type are connected for providing said means for supplying a first quiescent current; and a second resistance connected between said fourth terminal and said second node, at which the emitter electrode means of said second number of transistor means of said second conductivity type are connected, for providing said means supplying a second quiescent current.

15. A quasi-linear amplifier as called for in claims 9 or 14 wherein said means for sensing the smaller of the currents flowing in the principal current conduction paths of said third and fourth transistor means for providing a control response is of a type for providing as control response a control potential referred to said reference potential and wherein said means responsive to that control response includes:

a shunt regulating transistor of said first conductivity type having a common electrode connected to said first terminal, having an input electrode to which said control potential is applied, and having an output electrode; and third current divider means having an input connection to which the output electrode of said shunt regulating transistor connects and having first and second output connections respectively connected to the input connection of said first current divider means and to the input connection of said second current divider means, for apportioning the output current of said shunt regulating transistor substantially evenly between the input connections of said first and second current divider means.

16. A quasi-linear amplifier as called for in claim 15 wherein said third current divider means includes a pair of transistors of said first conductivity type connected in long-tailed pair configuration for amplifying and phase-splitting Class A input signal, which transistors have respective input electrodes for respectively receiving said input signal and a portion of the output signal appearing at said third terminal responsive to said input signal, having output electrodes respectively connected to separate ones of the second and first output connections of said third current divider means, and having common electrodes connected at the input connection of said third current divider means.

17. A quasi-linear amplifier as called for in claim 9, 12, 14, 15 or 16 wherein said means for sensing the smaller of the currents flowing in the principal current conduction paths of said third and fourth transistor means for providing a control response includes:

a current sensing resistance having a first end connected to said first terminal and having a second end to which the common electrode of said third transistor means connects and at which control potential corresponding to said control response appears by virtue of the output electrodes of said third and said fourth transistor means being respectively connected to the common electrode of said fourth transistor means and to said second terminal.

18. A quasi-linear amplifier as called for in claim 9 wherein said means for sensing the smaller of the currents flowing in the principal current conduction paths of said third and fourth transistor means for providing a control response is of a type for providing as control response a control potential referred to said reference potential and wherein said means responsive to that control response includes:

first and second shunt regulating transistors of said first conductivity type having respective input electrodes connected to receive said control potential, having respective output electrodes respectively connected to the input connection of said first current divider means and to the input connection of said second current divider means, and having respective common electrodes connected to said common terminal.

19. A quasi-linear amplifier as called for in claim 9 wherein said means for sensing the smaller of the currents flowing in the principal current conduction paths of said third and fourth transistors is of a type for providing as control response a control potential referred to said operating potential and wherein said means responsive to that control response includes:

first and second shunt regulating transistors of said first conductivity type having respective input electrodes referred in potential to said operating potential, having respective output electrodes respectively connected to the input connection of said first current divider means and to the input connection of said second current divider means, and having respective common electrodes to which said control potential is applied.

20. A circuit for sensing the smaller of first and second currents comprising:

first and second terminals for receiving an operating potential therebetween, first and second transistor means having respective input and output and common electrodes and exhibiting similar current gains between their respective input and output electrodes, each of said transistor means having its principal current conduction path between its output and common electrodes, means for respectively applying said first and second currents to separate ones of the input electrodes of said first and second transistor means;

a current sensing resistance in series connection with the principal current conduction paths of said first and second transistor means, the potential drop thereacross being proportional to the smaller of said first and second currents.

21. A circuit as set forth in claim 20 wherein the output electrode of said first transistor means connects to the common electrode of said second transistor means, the common electrode of said first transistor means connects to said first terminal via said current sensing resistance, and the output electrode of said second transistor means connects to said second terminal.

22. A circuit as set forth in claim 20 wherein the output electrode of said first transistor means connects to the common electrode of said second transistor means, the output electrode of said second transistor means connects to said second terminal via said current sensing resistance, and the common electrode of said first transistor means connects to said first terminal.

* * * * *

UNITED STATES PATENT AND TRADEMARK OFFICE
CERTIFICATE OF CORRECTION

PATENT NO. : 4,220,930

DATED : 9-2-80

INVENTOR(S) : Adel Abdel Aziz Ahmed

It is certified that error appears in the above-identified patent and that said Letters Patent is hereby corrected as shown below:

Column 8, line 9, change "$V_a$" to --$V_A$--.

Column 8, line 12, change "ahnd" to --and--

Column 9, line 39, change "P-n" to -- -n --.

Column 9, line 68, change "+$B_B$" to --$V_B$--.

Column 14, line 2, after "-" insert --and--.

Signed and Sealed this

Eighteenth Day of November 1980

[SEAL]

Attest:

Attesting Officer

SIDNEY A. DIAMOND

Commissioner of Patents and Trademarks